United States Patent
Biberger et al.

(10) Patent No.: US 8,816,303 B2
(45) Date of Patent: Aug. 26, 2014

(54) METHOD OF PROCESSING OF AN OBJECT

(75) Inventors: Josef Biberger, Wildenberg (DE); Ralph Pulwey, Aalen (DE); Jaroslaw Paluszynski, Oberkochen (DE); Dietmar Doenitz, Aalen (DE); Hans Mathèe, Heidelberg (DE); Michael Steigerwald, Westhausen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 13/164,122

(22) Filed: Jun. 20, 2011

(65) Prior Publication Data

US 2012/0145895 A1   Jun. 14, 2012

(30) Foreign Application Priority Data

Jun. 22, 2010   (DE) .......................... 10 2010 024 625

(51) Int. Cl.
*H01J 37/30*   (2006.01)
*H01J 37/305*   (2006.01)
*H01J 37/317*   (2006.01)
*H01J 37/304*   (2006.01)

(52) U.S. Cl.
CPC ......... *H01J 37/3056* (2013.01); *H01J 37/3174* (2013.01); *H01J 37/30* (2013.01); *H01J 37/3005* (2013.01); *H01J 37/3007* (2013.01); *H01J 37/304* (2013.01)
USPC ........ 250/492.3; 250/306; 250/307; 250/310; 250/311; 250/492.2

(58) Field of Classification Search
CPC . H01J 37/3174; H01J 37/3056; H01J 37/304; H01J 37/3007; H01J 37/3005
USPC ............ 250/306, 307, 311, 492.1, 492.3, 310
See application file for complete search history.

(56) References Cited

U.S. PATENT DOCUMENTS 6,839,470 B2 *   1/2005   Ikeda ............................ 382/266
6,855,938 B2     2/2005   Preikszas et al.

(Continued)

FOREIGN PATENT DOCUMENTS

DE   10 2006 059 162 A1   6/2008
DE   10 2008 045 336 A1   3/2010

OTHER PUBLICATIONS

Hiwon, L., et al., "Geometric Compensation of Focused Ion Beam Machining Using Image Processing" Applied Physics Express 1 (2008).*

(Continued)

*Primary Examiner* — Jack Berman
*Assistant Examiner* — Wyatt Stoffa
(74) *Attorney, Agent, or Firm* — Bruce D Riter

(57) ABSTRACT

A method of processing of an object comprises scanning a particle beam across a surface of the object and detecting electrons emerging from the object due to the scanning; determining a height difference between the surface of the object and a predetermined surface for each of plural of locations on the surface of the object based on the detected electrons; determining a processing intensity for each of the plural locations on the surface of the object based on the determined height differences; and directing a particle beam to the plural locations based on the determined processing intensities, in order to remove material from or deposit material on the object at the plural locations.

40 Claims, 3 Drawing Sheets

(56) References Cited

U.S. PATENT DOCUMENTS

| | | | |
|---|---|---|---|
| 6,894,294 B2* | 5/2005 | Shemesh | 250/492.21 |
| 7,223,983 B2 | 5/2007 | Kawasaki et al. | |
| 7,312,448 B2* | 12/2007 | Principe | 250/310 |
| 8,217,350 B2* | 7/2012 | Preikszas | 250/311 |
| 2004/0121069 A1* | 6/2004 | Ferranti et al. | 427/140 |
| 2004/0151991 A1* | 8/2004 | Stewart et al. | 430/5 |
| 2005/0103746 A1* | 5/2005 | Nadeau et al. | 216/62 |
| 2005/0118533 A1* | 6/2005 | Mirkarimi et al. | 430/316 |
| 2005/0184251 A1* | 8/2005 | Oi et al. | 250/492.3 |
| 2006/0017016 A1* | 1/2006 | Tappel | 250/492.21 |
| 2007/0018099 A1* | 1/2007 | Chitturi et al. | 250/310 |
| 2007/0023651 A1* | 2/2007 | Ishitani et al. | 250/309 |
| 2007/0194226 A1* | 8/2007 | Ward et al. | 250/309 |
| 2008/0035860 A1* | 2/2008 | Hill et al. | 250/492.3 |
| 2008/0174779 A1* | 7/2008 | Kaga et al. | 356/401 |
| 2008/0296498 A1* | 12/2008 | Hong | 250/311 |
| 2009/0111036 A1* | 4/2009 | Stewart et al. | 430/5 |
| 2009/0127458 A1* | 5/2009 | Ishitani et al. | 250/307 |
| 2009/0242759 A1* | 10/2009 | Bray et al. | 250/307 |
| 2009/0309025 A1 | 12/2009 | Preikszas | |
| 2010/0024730 A1* | 2/2010 | Bertagnolli et al. | 118/723 FE |
| 2010/0025578 A1* | 2/2010 | Hill et al. | 250/307 |
| 2010/0051828 A1 | 3/2010 | Doemer et al. | |
| 2010/0108506 A1* | 5/2010 | Nadeau et al. | 204/298.32 |
| 2011/0163068 A1* | 7/2011 | Utlaut et al. | 216/66 |
| 2011/0198497 A1* | 8/2011 | Biberger et al. | 250/307 |
| 2011/0240852 A1* | 10/2011 | Tanner | 250/307 |
| 2011/0297827 A1* | 12/2011 | Asai et al. | 250/310 |
| 2012/0025075 A1* | 2/2012 | Moore et al. | 250/307 |
| 2012/0074320 A1* | 3/2012 | Biberger et al. | 250/309 |
| 2012/0328151 A1* | 12/2012 | Warschauer et al. | 382/103 |

OTHER PUBLICATIONS

Drzazga, W. et al., "Three-dimensional characterization of microstructures in a SEM" Meas. Sci. Technol. 17 (2006) 28-31.*

H. Lee et al., "Geometric Compensation of Focussed Ion Beam Machining Using Image Processing", Applied Physics Express 1, 2008.

W. Drzazga et al., "Three-dimensional characterization of microstructures in a SEM", Measurement Science and Technology 17, 2006, p. 28-31.

F.A. Stevie et al., "Focused Ion Beam Gases for Deposition and Enhanced Etch", Introduction to Focused Ion Beams—Instrumentation, Theory, Techniques and Practice, Springer, Chapter 3, 2005, p. 53-72.

J. K. Maurin et al., "Height Measurements of Surface Features with the Scanning Electron Microscope", Metallography 10, 1977, p. 161-169.

Office action in German patent application No. 10 2010 024 625.5 dated Nov. 24, 2010.

* cited by examiner

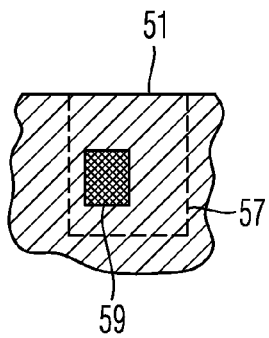 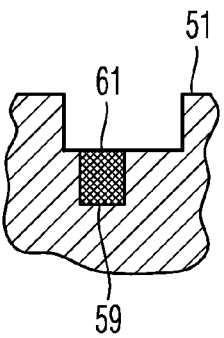 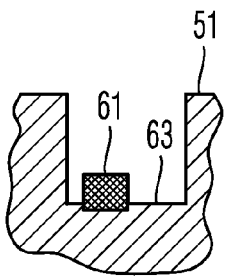 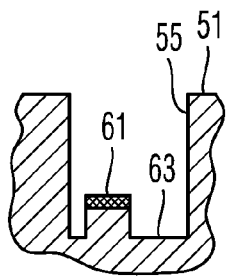
Fig. 3a    Fig. 3b    Fig. 3c    Fig. 3d
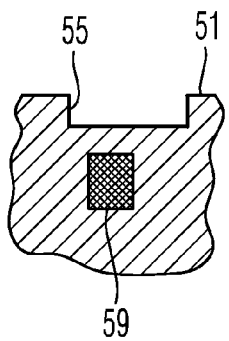 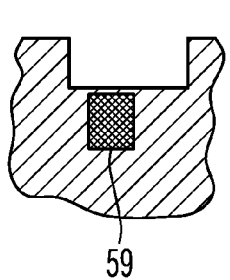 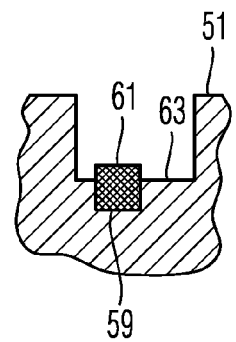 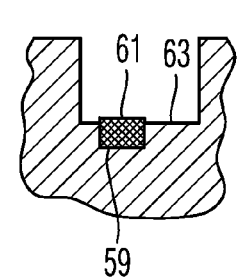
Fig. 4a    Fig. 4b    Fig. 4c    Fig. 4d
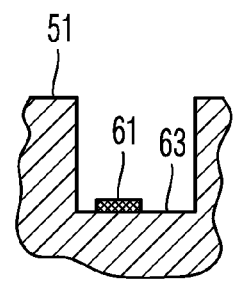 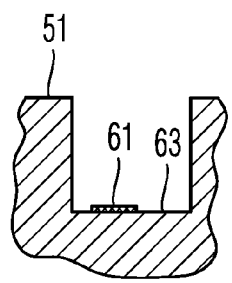 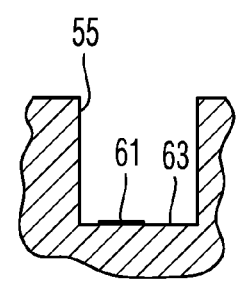 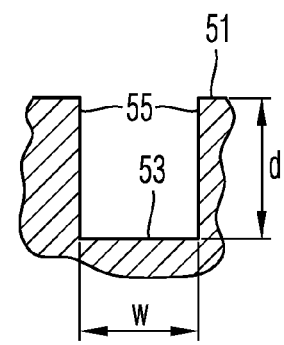
Fig. 4e    Fig. 4f    Fig. 4g    Fig. 4h

METHOD OF PROCESSING OF AN OBJECT

CROSS-REFERENCES TO RELATED APPLICATIONS

The present application claims priority of Patent Application No. 10 2010 024 625.5, filed on Jun. 22, 2010 in Germany, entitled "Method of Processing of an Object", the content of which is hereby incorporated by reference in its entirety.

FIELD

The present invention relates to methods of processing of an object using a particle beam.

BACKGROUND

A system comprising an electron beam column and an ion beam column having main axes extending under an angle relative to each other and intersecting a common work area can be used to process miniaturized objects. Herein, the electron beam column is operated as an electron microscope in order to obtain an image of a surface of the object to be processed. Locations which are to be processed on the surface of the object are determined based on the obtained image. The processing is then performed using an ion beam generated by the ion beam column. The ion beam may remove material from the surface of the object, wherein a suitable process gas may be supplied to the surface. The process gas is activated by the ion beam and causes an etching process. Such method is commonly referred to as ion beam milling or ion beam assisted etching. It is also possible to deposit material on the surface of the object using the ion beam. In such process, a suitable process gas is supplied to the surface of the object, and the ion beam activates the process gas to trigger a deposition process. Such method is commonly referred to as ion beam deposition.

An example of using such system for removal of material from a surface of an object is the manufacture of a section of a miniaturized device in order to assess a structure of the device or to determine an error in the structure of the device. In order to manufacture a sectional surface of the device, the ion beam is oriented nearly parallel to the manufactured sectional surface, and material is continuously removed from the sectional surface due to the action of the ion beam. The process of the removal of the material can be monitored using the electron microscope by orienting the sectional surface orthogonally to the main axis of the electron beam column and recording an electron microscopic image of the sectional surface. Based on the image it is possible to decide whether the material removal has reached a desired depth or whether additional material removal is required. If further material removal is required, the sample is again oriented such that the sectional surface is nearly parallel to the ion beam, and a further processing using the ion beam is performed.

Applying such method to larger objects allows to manufacture sectional surfaces having only a limited range of orientations relative to the object, relative to the ion beam column and relative to the electron beam column.

A further method in which the system illustrated above can be used is illustrated in the article "Geometric Compensation of Focused Ion Beam Machining Using Image Processing" von Hiwon Lee et al., Applied Physics Express 1 (2008). The method includes producing of a trench having a predetermined rectangular cross section in an object using an ion beam. In practice, the cross section of the manufactured trench will deviate from the desired cross section due to a re-deposition of sputtered material. The article illustrates the possibility of producing a cross section of a trench manufactured according to a first method and determining from such cross section those regions of the trench requiring a higher or a lower removal of material. Based on this information, the distribution of the ion beam intensity across the trench is corrected in a next corrected method. Such processing can be repeatedly performed in that a cross section is produced from a trench manufactured in a corrected method wherein a further correction for a further next corrected method is determined based on this cross section. If a method has been sufficiently corrected, it can be used to manufacture a plurality of trenches having a same geometry in a same object material.

Such processing is time consuming and does not always achieve the desired results.

SUMMARY

The present invention has been accomplished taking the above problems into consideration.

It is an object of the present invention to provide a method of processing of an object in which a surface of an object having a desired shape can be manufactured using a particle beam.

According to certain embodiments, a method of processing of an object comprises scanning a particle beam across a surface of the object and detecting electrons emerging from the object due to the scanning; determining a height difference between the surface of the object and a predetermined surface for each of plural of locations on the surface of the object based on the detected electrons; determining a processing intensity for each of the plural locations on the surface of the object based on the determined height differences; and directing a particle beam to the plural locations based on the determined processing intensities, in order to remove material from or deposit material on the object at the plural locations.

The electrons emerging from the object due to the scanning are those electrons which are released from the object as a result of the incidence of the particles of the particle beam on the object. In embodiments in which the particle beam incident on the object is an electron beam, the electrons emerging from the object due to the scanning comprise, for example, secondary electrons and backscattered electrons.

The processing intensities for the plural locations on the surface of the object can be adjusted according to plural different methods. For example, a beam current of the particle beam can be varied from location to location in order to adjust the processing intensity as required according to the determination. According to another example, a dwell time of the particle beam can be varied from location to location in order to adjust the processing intensity as required according to the determination. Herein, the dwell time designates a duration during which the particle beam remains stationary at a same location in order to process the surface of the object at this location. At the end of the dwell time, the particle beam is directed to a subsequent location. According to a still further example, a kinetic energy of the particles of the particle beams can be varied from location to location in order to adjust the processing intensity as required according to the determination.

A variation of the properties determining the processing intensity, such as beam current, dwell time and beam energy can be significant in that there exists at least one pair of locations on the surface of the object between which the respective property is varied by more than 10%, for example.

According to exemplary embodiments, the particle beam used for the scanning is an ion beam, and the particle beam used for the removal and/or the deposition of the material is also an ion beam. Herein, the ion beam used for the scanning and the ion beam used for the removal and/or the position of material can be generated by a same ion beam column or by separate ion beam columns.

According to other exemplary embodiments, the particle beam used for the scanning is an electron beam, and the particle beam used for the removal and/or the deposition of the material is also an electron beam. Herein, the electron beam used for the scanning and the electron beam used for the removal and/or the position of material can be generated by a same electron beam column or by separate electron beam columns.

According to still further exemplary embodiments, the particle beam used for the scanning is an electron beam generated by an electron beam column, and the particle beam used for the removal and/or deposition of material is an ion beam generated by an ion beam column.

According to some embodiments herein, an orientation of the object relative to the ion beam column is not changed between the scanning of the electron beam across the surface of the object and the directing of the ion beam to the plural locations of the object, or the orientation is changed only by a small amount between the scanning of the electron beam across the surface of the object and the directing of the ion beam to the plural locations of the object. According to exemplary embodiments herein, the changing of the orientation by a small amount includes changing of the orientation by an angle which is smaller than half of the angle between the main axis of the electron beam column and the main axis of the ion beam column. According to further examples, the angle by which the orientation of the object is changed is smaller than one third, one fifth or one tenth of the angle between the main axis of the electron beam column and the main axis of the ion beam column.

According to an exemplary embodiment, a method of processing of an object comprises positioning of the object simultaneously in a work area of an electron beam column and in a work area of an ion beam column. A surface of the object is scanned using an electron beam generated by the electron beam column, and electrons caused by the scanning are detected. Such scanning and detecting is performed in at least two angular configurations. Subsequently, the ion beam is directed to locations on the surface of the object based on detection signals generated in the scanning and detecting, in order to remove material from the surface of the object at those locations.

In the conventional method illustrated above, the ion beam is oriented substantially parallel to the surface which is processed by the ion beam. If this surface is to be inspected using the electron beam column, the surface has to be oriented substantially orthogonal to the main axis of the electron beam column in order to obtain a high resolution electron microscopic image of the surface. However, the ion beam will typically not be oriented parallel to the surface in such configuration. Therefore, a change of the orientation of the object relative to the particle beam columns is required between processing steps performed using the ion beam column and processing steps using the electron beam column. The present inventors have found that it is possible to manufacture, using the ion beam, surfaces and, in particular, flat surfaces, which are not oriented parallel to the ion beam. However, this requires that locations of the surface which project from a remaining surface of the object are detected and that the ion beam is specifically directed to such locations projecting from the remaining surface in order to remove material from such projecting locations. The inventors have solved this problem by providing a particular particle optical inspection method inspecting the surface of the object in at least two angular configurations. Detection signals obtained during the scanning of the particle beam across the surface of the object in the at least two different angular configurations allow to reconstruct the three dimensional shape of the surface of the object. If the three dimensional shape of the object is known, it is also possible to determine those locations of the surface of the object which project from a remaining surface of the object or an average surface of the object. It is then possible to direct the ion beam to such projecting locations in order to flatten the surface of the object.

According to conventional methods, the manufacture of a flat surface was only possible under a grazing incidence of the ion beam onto the surface, in which the ion beam is oriented nearly parallel to the surface. According to the embodiment illustrated above, locations of the object projecting from a surrounding surface are identified, and the ion beam is specifically directed to those locations such that material is removed from the projecting locations, such that an ion beam under grazing incidence onto the surface is not required to remove material from locations projecting from the surrounding surface.

Moreover, it is not necessary to change the orientation of the object relative to the particle beam column between the scanning and the directing of the particle beam onto the surface.

According to embodiments, a size of the surface processed by the method is greater than 0.1 $\mu m^2$, greater than 10 $\mu m^2$, greater than 500 $\mu m^2$ and/or greater than 10,000 $\mu m^2$. According to further exemplary embodiments, the surface of such size is a flat surface.

Herein, all processing methods performed using a particle beam and illustrated in this disclosure may remove material from the surface of the processed object or deposit material on the surface of the processed object.

According to further exemplary embodiments, the processed surface is not necessarily a flat surface and may have an arbitrary target shape. In order to determine the locations on the surface to which the ion beam is to be directed for removing material from or depositing material on the surface, deviations of the shape of the actual surface from the target shape of the desired surface are determined, wherein the shape of the actual surface is determined by scanning of the particle beam across the surface and detecting electrons emerging from the surface due to the scanning. Based on the knowledge of such deviations it is possible to determine those locations on the surface of the object which project relative to the desired shape of the object, and to direct the particle beam to those locations in order to remove material from the surface of the object at those locations. Alternatively, it is possible to determine those locations on the surface of the object which are recessed relative to the desired shape of the object and to direct the particle beam to those recessed locations in order to deposit material at those recessed locations.

Using such method it is possible to reduce deviations of the actual shape of the object from the desired shape of the object. Differences between the target shape and the actual shape of the object can be represented in terms of $\sigma_{RMS}$, wherein $\sigma_{RMS}$ designates a root-mean-square value of these locations, wherein the root-mean-square value is determined at a given length scale. According to exemplary embodiments, the length scale at which $\sigma_{RMS}$ is determined may have values from 0.2 µm to 100 µm, for example. For such length scales, it is possible to obtain $\sigma_{RMS}$ values from within a range from 5 nm to 1 µm using the methods illustrated above.

According to embodiments, the processed surface includes a first surface portion provided by a first material and a second surface portion provided by a second material, wherein the first and second surface portions are different from each other and wherein the first and second materials differ with respect to a material removal rate obtainable by directing the particle beam to these materials. For example, the material removal rates of the first and second materials may differ by a factor of more than 1.5 such that the greater material removal rate is more than 1.5 times greater than the smaller material removal rate.

According to particular embodiments herein, the first and second surface portions are portions within a greater flat surface of the object. Moreover, plural different materials of the object may provide the object surface of the object having a predetermined target shape. It is thus possible to manufacture the object having the desired target shape even in situations in which an object of a not previously known structure and distribution of materials provides varying material removal rates on its surface.

Within the context of the present disclosure, the material removal rate designates a volume of material which can be removed from the object by directing a given amount of integrated beam current (charge) of the particle beam used for the processing to the location. For example, the material removal rate of the material designates a volume of material which can be removed from the object by directing a given amount of integrated beam current (charge) of the particle beam used for the processing to the location. For example, the material removal rate of the material copper can be 0.13 µm³/nC if a particle beam of Gallium ions having a beam energy of 30 keV is used.

BRIEF DESCRIPTION OF THE DRAWINGS

The forgoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

FIGS. 3a to 3d illustrate processing steps in a conventional method of processing of an object;

FIGS. 4a to 4h illustrate processing steps in a further method of processing of an object.

DETAILED DESCRIPTION OF EXEMPLARY EMBODIMENTS

Figure 1:
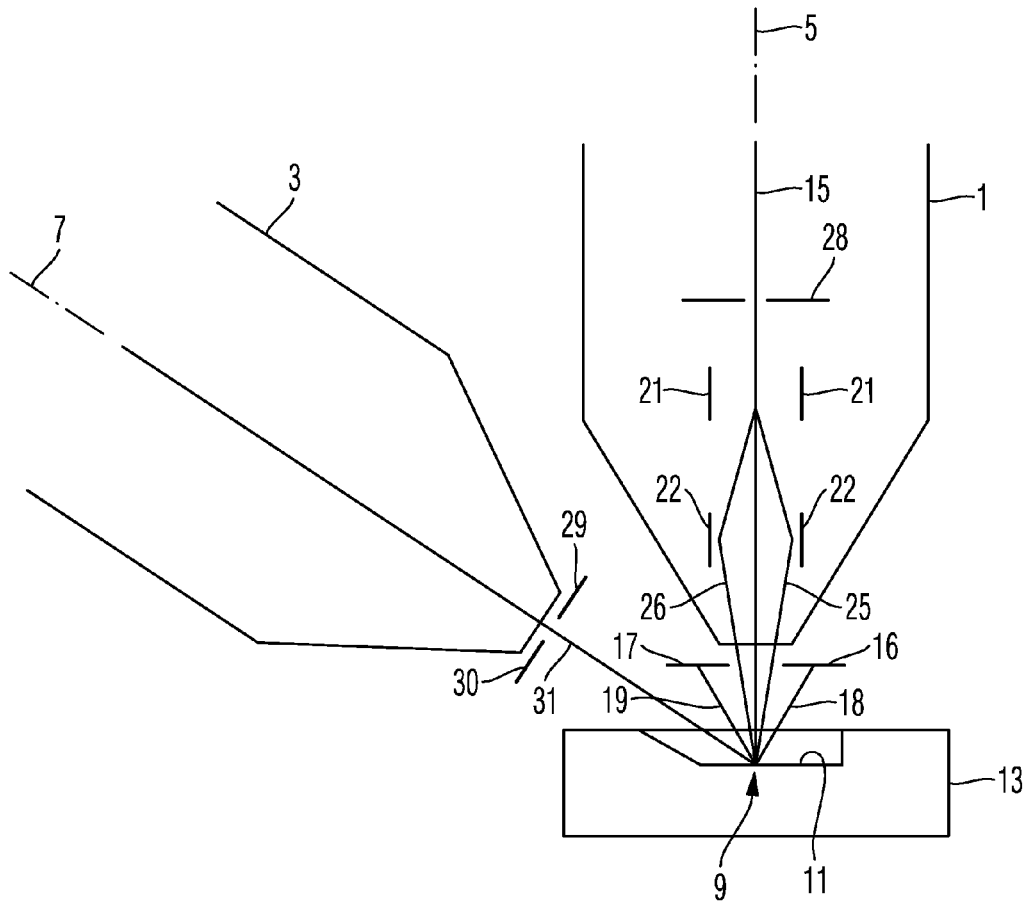
FIG. 1 is a schematic illustration of a processing system.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

FIG. 1 is a schematic illustration of a processing system comprising an electron beam column 1 and an ion beam column 3. The electron beam column 1 and the ion beam column 3 are positioned relative to each other such that a main axis 5 of the electron beam column 1 intersects a main axis 7 of the ion beam column 3, and such that a work area of the electron beam column 1 overlaps with a work area of the ion beam column 3. An object 13 to be processed can be positioned in the overlapping work areas.

Background information relating to systems comprising particle beam columns having overlapping work areas can be obtained from, for example, US 2005/0184251 A1, U.S. Pat. No. 6,855,938 and US 2009/0309025 A1, wherein the full disclosure of these documents is incorporated herein by reference.

In the illustration of FIG. 1, a surface 11 of an object 13 is positioned within a common work area 9 of the electron beam column 1 and the ion beam column 3 such that a surface normal of the surface 11 is oriented substantially parallel to the main axis 5 of the electron beam column 1. The substantially orthogonal orientation of the surface 11 relative to the main axis 5 of the electron beam column 1 has an advantage in that a symmetry of electric and magnetic fields generated by the electron beam column 1 for focusing of an electron beam in the work area 9 is substantially not affected by the presence of the object 13. A high symmetry of the focusing electric and magnetic fields may be necessary for achieving a narrow beam focus of the electron beam on the object and, thus, a high resolution of recorded electron microscopic images. If the surface of the object was oriented under an angle relative to the main axis of the electron beam column, a best focusing of the beam and a highest resolution of an electron microscopic image of the surface might not be achievable.

The electron beam column 1 is configured to scan an electron beam 15 across the surface 11 of the object 13 and to detect electrons caused by the scanning of the object, in order to record electron microscopic images of the surface 11. The electron beam column 1 is further configured to perform the scanning and the detecting in at least two different angular configurations. There exist plural options to perform the scanning and detecting in at least two different angular configurations. Two of these options are illustrated in FIG. 1.

According to a first option, the two angular configurations are achieved by detecting the electrons caused by the scanning in two different angular configurations. For example, two different electron detectors 16 and 17 can be provided, wherein electrons emerging from the object into different ranges of solid angles are incident on different detectors. Electrons emitted from the object into a first range of solid angles are incident onto the first electron detector 16, and electrons emitted from the object into a second range of solid angles are incident on the second detector 17. The first and second ranges of solid angles are not identical such that main axes of the two ranges of solid angles are oriented under an angle relative to each other. The first and second ranges of solid angles may overlap. However, FIG. 1 shows a situation in which the two ranges of solid angles into which the electrons detected by the detectors 16 and 17, respectively, do not overlap and wherein the main axes of the two ranges of solid angles are designated by reference numerals 18 and 19, respectively. Two or more detectors 16, 17 positioned in different ranges of solid angles relative to the work area 9 provide two or more different angular configurations for the scanning and detecting. A three-dimensional shape of the surface 11 of the object 13 can be determined by analyzing detection signals generated by the two or more detectors 16, 17. Background information relating to determination of the three dimensional shape of an object can be obtained from the article "Three-Dimensional Characterization of Microstructures in a SEM", Wlodzimierz Drzazga et al., Meas. Sci. Technol. 17 (2006) 28-31, wherein the disclosure of this article is incorporated by reference in its entirety into the present application.

A second option of providing two different angular configurations shown in FIG. 1 includes two different angular configurations of the particle beam incident on the object. For this purpose, the electron beam column 1 comprises a deflection system configured to tilt the electron beam about its location of incidence on the sample. In the illustrated example, the deflection system comprises two deflectors 21 and 22 arranged at a distance from each other along the main axis 5 of the electron beam column 1. It is possible to change an orientation of the direction of incidence of the electron beam 15 onto the surface 11 by operating the deflectors 21 and 22. Reference numeral 25 in FIG. 1 designates an electron beam which is incident onto the surface 11 at a first angle of incidence in a first setting of energizations of the deflectors 21 and 22, and reference numeral 26 in FIG. 1 designates an electron beam which is incident onto the surface 11 at a second angle of incidence in a second setting of energizations of the deflectors 21 and 22.

In this second option of achieving the at least two different angular configurations, it is sufficient to provide an electron detector which is positioned relative to the work area 9 such that electrons caused or released from the surface 11 by the scanning can be incident on the detector. For example, the detector may be positioned at locations indicated by the illustrated detectors 16, 17, or it can be positioned at a different location, such as the detector 28 positioned within the electron beam column. A first set of detection signals is recorded when the primary electron beam 15 is incident onto the surface 11 under the first angular configuration 25 and scanned across the surface, and a second set of detection signals is recorded when the primary electron beam 15 is incident onto the surface 11 under the second angular configuration 26 and scanned across the surface.

It is possible to reconstruct the three-dimensional shape of the surface of the object by analyzing and comparing the two sets of recorded detection signals. Background information relating to providing different angular configurations for the scanning of an electron beam can be obtained from U.S. Pat. No. 7,223,983 B2, wherein the disclosure of this document is incorporated herein by reference in its entirety.

The two options of providing two different angular configurations for the scanning and detecting illustrated in FIG. 1 can be used independently from each other. For example, it is possible to provide two or more detectors which differ with respect to ranges of solid angles of incident electrons, while the option of varying the direction of incidence of the electron beam onto the surface is not provided, such that the electron beam is, for example, always oriented parallel to the main axis 5 of the electron beam column. On the other hand, it is possible to provide the at least two different angular configurations by scanning the electron beam across the surface using at least two different directions of incidence of the scanning beam, while ranges of solid angles into which the electrons emerging from the surface are emitted, are not analyzed. Moreover, it is of course possible to provide plural options of achieving different angular configurations in one system, such as it is the case in the system illustrated in FIG. 1 in which the two deflectors 21 and 22 allow to vary the angular configuration of the scanning beam and where the two detectors 16 and 17 allow to vary the angular configuration of the detected electrons.

Accordingly, it is possible to determine the three-dimensional shape of the surface 11 of the object 13 by recording detection signals for the at least two different angular configurations. As a consequence, the information contained in the recorded detection signals not only relates to positions of locations on the surface of the object in a lateral direction transverse to the main axis 5 of the electron beam column 1 but also to positions of the locations in a height direction or a direction parallel to the main axis 5. It is thus possible to determine how the three dimensional shape of the surface of the object as measured using the electron beam column 1 conforms with a target shape of the object. The target shape of the object can be defined, for example, by a customer requesting the processing of the object. It is thus possible to determine locations on the surface of the object at which material has to be removed from the object or at which material has to be deposited on the surface of the object in order to make the surface of the object better conform with its target shape. Based on such information it is possible to operate the ion beam column 3 in order to process the object 13 such that the three dimensional shape of the surface of the object gets closer to the target shape and, eventually, substantially corresponds to the target shape.

For this purpose, the ion beam 31 is directed to the previously determined locations on the surface in order to remove material from the surface or deposit material on the surface. The removal of material from the previously determined locations can be achieved by directing the ion beam to those locations, wherein the ion beam releases particles from the surface of the object due to its kinetic energy. Moreover, a processing gas can be supplied to the surface of the object, wherein the processing gas is activated by the ion beam at its location of incidence, and wherein the activated process gas will remove material from the surface of the object by a process such as etching. A deposition of material at the selected locations can be achieved by directing the ion beam to these locations and supplying a suitable processing gas to the surface which is activated by the ion beam and results in material deposition at the location of incidence of the beam.

Background information relating to removal of material from and deposition of material on surfaces can be obtained from the article "Focused Ion Beam Gasses for Deposition and Enhanced Etch" from F. A. Stevie et. al. in "Introduction to Focused Ion Beams—Instrumentation, Theory, Techniques and Practice", Springer 2005, chapter 3, pages 53 to 72.

Figure 2A:
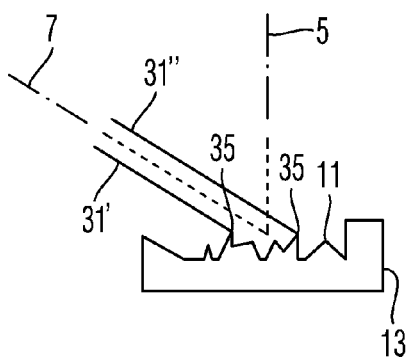
FIGS. 2a to 2c illustrate processing steps in a method of processing of an object.
Figure 2B:
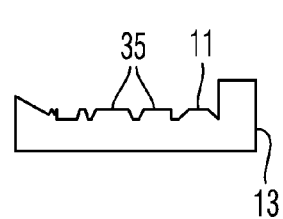
Figure 2C:
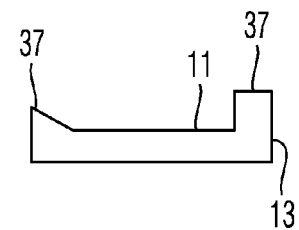

FIGS. 2a to 2c are schematic illustrations of a method of processing of an object. FIG. 2 shows a cross section of the object 13 where the surface 11 of the object has reached its desired target shape, which is the shape of a flat surface in the illustrated example. FIG. 2a shows a cross section of the object 13 at the beginning of the processing. At the beginning, the surface 11 has a rough, bumpy shape. Reference numerals 35 designate two exemplary locations on the surface 11 which project relative to the target shape in a direction of the main axis 5 of the electron beam column 1. These locations 35 are identified in an inspection step performed using the electron beam column 1. The inspection includes the scanning and detecting in at least two different angular configurations, analyzing recorded detection signals and determining of the three dimensional shape of the surface 11. As soon as the locations 35 are determined, the ion beam 31 is directed to these locations 35. In the example illustrated in FIG. 2a, the ion beam which is first directed to one of the two exemplary locations 35 is designated by reference numeral 31', and the ion beam which is subsequently directed to the other exemplary location 35 is designated by the reference numeral 31". The ion beam incident on the locations 35 projecting from the target surface removes material from the surface of the object at those locations, wherein the removal is achieved by the ions themselves and/or an activated processing gas.

Subsequent to such processing involving directing the ion beam to plural determined locations, the shape of the surface 11 will be closer to the target shape (shown in FIG. 2c) as illustrated in FIG. 2b. FIG. 2b again shows a cross section through the object 13, wherein it is apparent that a roughness of the surface 11 is reduced as compared to the configuration shown in FIG. 2a. A scanning and detecting of this surface in at least two different angular configurations can be applied to the surface 11 shown in FIG. 2b, in order to determine the three dimensional shape of the surface 11 and to again determine locations 35 at which the surface projects from the target shape in the direction of the main axis 5 of the electron beam column 1. The ion beam 31 can be subsequently directed to these locations 35 for removing material from those locations until the shape of the surface 11 substantially corresponds to the target shape, which is the flat surface in the illustrated example. The three dimensional shape of the resulting surface can be again determined using the electron beam column 1 for verifying that the shape sufficiently conforms with the target shape and to determine that a further processing with the ion beam is not necessary and that the manufacture of the object having the target shape is completed.

In order to determine whether the shape of the inspected surface sufficiently conforms with the target shape it is possible to determine a height difference between the measured shape and the target shape at a plurality of locations and to determine the maximum difference among those differences. If the maximum difference is greater than a predetermined threshold, the processing using the ion beam is to continue, whereas the manufacture of the surface is completed if the maximum difference is less than the predetermined threshold value.

In a configuration of the electron beam column 1 relative to the ion beam column 3 and relative to the target shape as illustrated with reference to FIGS. 1 and 2 above, it is possible to perform processing steps alternating between processing steps using the electron beam column and processing steps using the ion beam column, wherein a change of orientation of the object 13 relative to the main axes 5 and 7 of the beam columns 1 and 3, respectively, is not necessary. In such configuration it is in particular possible to manufacture a substantially flat surface of an object using a processing ion beam which does not fulfill the grazing incidence condition in which the direction of the incident ion beam is substantially parallel to the manufactured surface. This is the reason why a change of orientation of the object is not absolutely necessary, such that the time consuming steps of changing the orientation and repositioning of the object relative to the particle beam columns can be omitted such that the processing can be completed within a shorter period of time.

Moreover, it is possible to produce objects having geometries and target shapes which were not possible to produce according to conventional methods. For example, it would not be possible to manufacture the object shown in FIG. 2c using an ion beam fulfilling a grazing incidence condition since the shoulders 37 projecting from the surface 11 prevent the grazing incidence of the ion beam on the surface 11.

The target shape of the surface manufactured in the method illustrated with reference to FIG. 2 above is the flat surface. It is, however, also possible to define target shapes which differ from the flat surface and to manufacture corresponding surfaces. For example, the target shape may be the shape of a pyramid, a spherical cap or any other desired shape. It is in particular possible, to manufacture trenches in an object, wherein the trench has a bottom surface having a target shape.

In particular, the bottom surface of the trench can be a flat surface. Moreover, the surface of the object can be provided by different materials which differ with respect to their material removal rates as illustrated with reference to FIGS. 3 and 4 below.

FIGS. 3a to 3d illustrate a conventional method of manufacturing of an object having a target shape and using an ion beam column, and FIGS. 4a to 4h illustrate a method of manufacturing of an object having a same target shape using the principles illustrated above. The object having the target shape is shown in FIG. 4h. The object is made of a material, such as copper, and has an upper surface 51 in which a trench having a depth d and a width w is formed, wherein the trench comprises a bottom surface 53 oriented parallel to the top surface 51 and four vertical sidewalls 55.

FIG. 3a shows the object in the un-worked condition having a contiguous upper surface 51, wherein the target shape is shown as a broken line 57. A rectangle 59 in FIG. 3a designates an inclusion of a foreign material or a crystal grain having a crystal orientation different than a crystal orientation of a surrounding matrix. According to the conventional method of manufacture of the object having the target shape 57, the ion beam is systematically scanned across those portions of the surface 51 at which the trench is to be manufactured. Herein, a total dose or total charge amount of ions incident per unit area is predetermined such that a trench having the desired depth d is produced if the material of the object has the expected material removal rate. FIGS. 3b to 3d show plural steps of such method.

FIG. 3b shows a state in which the material removal proceeded as desired and has reached the foreign material 69 providing a surface portion 61 of the bottom surface of the trench manufactured so far. The foreign material 59 has, in the illustrated example, a material removal rate which is smaller than the material removal rate of the material in the surface portions 63 surrounding the surface portion 61. Since the presence of the foreign material was not known at the time when the manufacturing method was planned and designed, the manufacturing method will continue unchanged, and the bottom surface of the trench will be continuously scanned such that all locations on the bottom surface receive a same ion dose in order to achieve a same material removal rate at all locations on the bottom surface. Due to the presence of the foreign material this will not be possible, however. In the surface portion 61, in which the foreign material provides the surface of the object, the material removal rate is smaller than in the remaining surrounding surface portions, such that a step is formed at the bottom of the trench as shown in FIG. 3c.

FIG. 3d shows a situation in which the manufacturing method has been completed and in which surface portions 63 in which the foreign material 59 does not provide the surface have reached the desired depth d since the required ion dose per unit area was determined accordingly. However, the material removal process is not completed in the surface portion 61 such that the desired depth d is not reached in this surface portion 61. The manufactured object does not conform with the desired target shape, accordingly.

FIGS. 4a to 4h illustrate a method of manufacturing of an object having the target shape shown in FIG. 4h according to the principles illustrated with reference to FIGS. 1 and 2 above. According to this method, processing steps using the electron beam column and processing steps using the ion beam column are automatically performed, wherein a three dimensional shape of the surface is determined and compared with a target shape of the current manufacturing step in the processing steps using the electron beam column. Each next processing step using the ion beam column is planned based on the determined current three-dimensional surface shape. FIG. 4a shows a state in which the manufacture of the trench is achieved to a certain depth. In the subsequent determination of the three dimensional shape of the object it is found that the bottom of the trench is provided by a flat surface, and all surface portions of the bottom of the trench will receive a same processing intensity in the subsequent processing step using the ion beam column, such that a same material removal rate is achieved for all locations on the bottom surface. Subsequent to such processing, a processing state is reached which is shown in FIG. 4b. Again, the determination of the three dimensional shape reveals that the bottom surface is a flat surface, and a constant distribution of the processing intensity across the bottom of the trench is used in the next processing step using the ion beam column. However, now the foreign material 53 will surface such that the material removal will proceed at a lower rate in the surface portion 61 of the bottom surface in which the foreign material 53 provides the surface. Such situation is shown in FIG. 4c. If the three dimensional shape of the surface is determined in the state as shown in FIG. 4c, it will be found that the locations of the surface in the surface portion 61 project from the remaining surface in a direction of the main axis 5 of the electron beam column. In response thereto it is possible to direct ions in a subsequent processing step using the ion beam column 3 only to the surface portion 61, or to direct the ions to the surface portion 61 with a higher processing intensity than to surrounding surface portions 63. As a consequence, a higher amount of material is removed in the surface portion 61 than in the surrounding surface portion 63 as shown in the processing state of FIG. 4d in which the whole bottom of the trench has a nearly flat surface as it will be confirmed in a next processing step using the electron beam column. Thereafter, the ion beam will be directed to all surface portions of the bottom of the trench using a same dose or processing intensity, such that the processing state shown in FIG. 4e is achieved in which the surface portion 61 again projects relative to the surrounding surface portions 63. By repeatedly performing the processing steps using the electron beam column in which the three dimensional shape of the object is determined, and using the ion beam column 3 in which the ion beam is directed to selected locations on the surface based on the three dimensional shape determined in the preceding step using the electron beam column, it is possible to eventually achieve the final shape of the object illustrated in FIG. 4h, wherein FIGS. 4f and 4g show intermediate processing steps.

In the illustrated method, the processing intensity of the particle beam is adjusted locally for the processed location. This can be achieved by directing the particle beam only to those locations which require a more intense processing while a processing of remaining locations requiring a relatively reduced processing is not performed at all until the shape of the surface conforms with the desired shape at a given processing state.

However, this can also be achieved by applying an increased processing intensity to those locations requiring a more intense processing while other locations requiring a relatively reduced processing are processed with a reduced processing intensity. This allows to avoid increasing differences between the desired shape of the surface in a given processing state and the actual shape of the surface. The desired shape in a given processing state will change when the processing continues.

There are plural options to locally change the processing intensities: For example, the beam current of the particle beam can be locally changed, the dwell time of the particle beam at a respective processing location can be locally changed, and the beam energy of the particle beam can be locally changed.

For example, the dwell time of the particle beam at a respective processing location having coordinates (x,y) can be determined as follows:

$t_{DC}(x,y) = a(x,y) t_{DN}(x,y)$ with $a(x,y) = (\Delta H(x,y) + H_{Step})/H_{Step}$ for $\Delta H(x,y) \geq -H_{Step}$ and $a(x,y) = 0$ otherwise, wherein $t_{DN}(x,y)$ is the nominal value of the dwell time in a given processing step,
$t_{DC}(x,y)$ is the location dependent dwell time,
$a(x,y)$ is a location dependent correcting factor,
$\Delta H(x,y)$ is the measured location dependent height difference, and
$H_{Step}$ is the scheduled removal depth for a processing step.

While it is possible in the method illustrated with reference to FIG. 2 above to perform alternating processings with the electron beam column and the ion beam column without changing of the orientation of the object, it may be necessary to change the orientation of the object relative to the particle beam columns between processing steps. Herein, it can be advantageous to orient the object relative to the electron beam column such that the bottom surface of the trench and/or the upper surface 51 of the object are substantially orthogonal to the main axis of the electron beam column in processing steps involving the electron beam column, while these surfaces are oriented substantially orthogonal to the main axis of the ion beam column during processing steps performed using the ion beam column.

Figure 5:
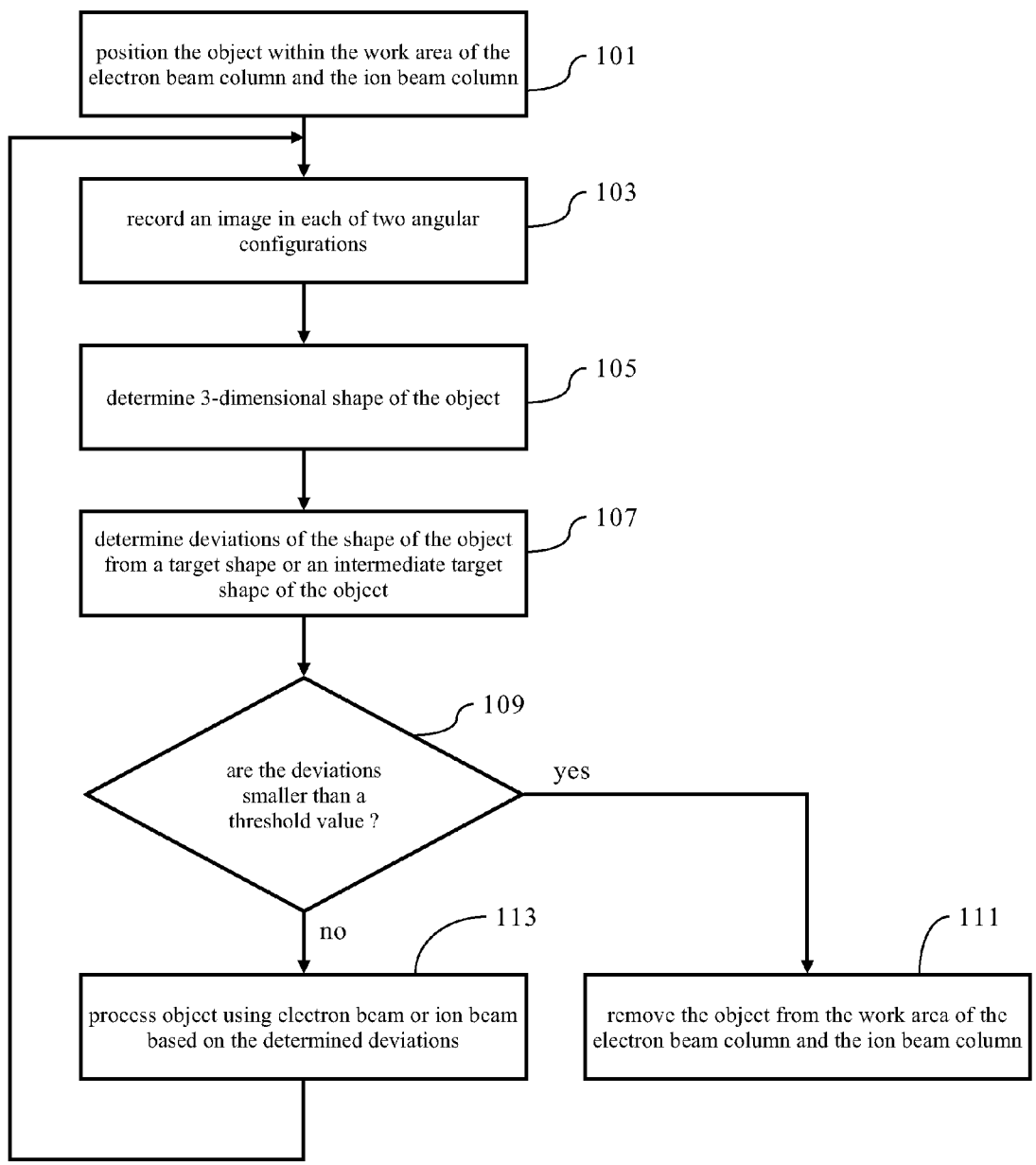
FIG. 5 is a flow chart illustrating a method of processing of an object.

A further method of processing of an object will be illustrated with reference to the flow chart of FIG. 5 below.

In a step 101, an object to be processed is mounted in a processing system such that a surface portion of the object which is to be processed is positioned within a work area of an electron beam column and, simultaneously, within a work area of an ion beam column. Images of the surface of the object are recorded in two different angular configurations in a step 103 using the electron beam column. The three-dimensional shape of the surface of the object is determined in a step 105 based on the images recorded in the different angular configurations. Deviations of the determined three-dimensional shape of the object from a target shape or from an intermediate target shape of the object are determined in a step 107. The target shape of the object is the desired shape of the surface of the object when the manufacture is completed. The intermediate target shape is the shape of the surface of the object in a current processing step. In a step 109 it is determined whether the deviations are greater than a threshold value or smaller than a threshold value. If the deviations are smaller than the threshold value, the processing is terminated and the object is removed from the system in a step 111. If the deviations from the target shape are greater than the threshold value, a processing of the surface of the object using the ion beam is performed in a step 113, wherein the ion beam is directed to those locations of the object requiring an increased processing intensity as determined in the step 107. When the processing using the ion beam column in step 113 is completed, the processing is continued at step 103, in order to record new images of the object in plural angular configurations, to determine the three-dimensional shape of the object (step 105), to determine deviations of the shape of the object and the target shape (step 107) and to again determine (step 109) whether the processing can be terminated (step 111) or continued (step 113).

In the embodiments illustrated above, an ion beam is used to process the object i.e. to remove material from or to deposit material on the object, and an electron beam is used for scanning of the object to generate detectable electrons. It is, however, also possible to use one single ion beam column and to use the ion beam generated by this ion beam column for both the scanning of the object in order to generate detectable electrons and for processing of the object, i.e. removal of material from and deposition of material on the object. Herein, the beam energy of the ion beam used for the scanning can be different from the beam energy of the ion beam used for the processing.

If an ion beam column is used to generate the particle beam for scanning of the object in order to generate detectable electrons, it is also possible to provide plural angular configurations. This can be achieved, for example, by beam deflectors configured to vary a direction of incidence of the particle beam onto the surface of the object, by using plural detectors covering different ranges of solid angles for the electrons emerging from the surface of the object, or by tilting of the surface of the object relative to the particle beam column.

It is further possible to use a configuration of two particle beam columns as illustrated in FIG. 1, wherein both particle beam columns are ion beam columns. It is then possible to perform the scanning of the object with one ion beam column and to perform the processing of the object with the other ion beam column. The ion beam columns may differ with respect to the type of ions forming the particle beams. For example, ions having a weight of less than 20 atomic mass units, such as, for example, helium ions or other noble gas ions, can be used to form an ion beam for scanning of the object in order to generate detectable electrons. An example of such ion beam apparatus is illustrated in US 2007/0194226 A1. The ion beam column used for processing of the object may include an ion beam source generating a beam of ions having atomic masses of more than 20 atomic mass units, such as, for example, gallium ions. The two ion beam columns generating different ion beams which differ with respect to the mass of the ions can be configured such that the emitted ion beams are directed to a common work area. For this purpose, the main axis of the two ion beam columns can be oriented relative to each other under an angle of more than 10°, such as, for example, 20° to 60°.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

What is claimed is:

1. A method of processing of an object, wherein the method comprises:
    a sequence, wherein the sequence comprises:
        scanning a particle beam across a surface of the object and detecting electrons emerging from the object due to the scanning;
        determining a height difference between a predetermined surface and the surface of the object for each of a plurality of locations of the predetermined surface of the object based on the detected electrons;
        determining a processing intensity for each of the plurality of locations of the predetermined surface of the object based on the determined height differences; and
        directing a particle beam to the plurality of locations based on the determined processing intensities, in order to remove material from or deposit material on the object at the plurality of locations,
    wherein the sequence is repeatedly performed for each of the plurality of locations of the predetermined surface of the object,
    wherein the object is simultaneously located within a work area of a particle beam column generating the particle beam used for the scanning of the particle beam across the surface of the object and a work area of a particle beam column generating the particle beam used for the removing and the depositing of material, respectively,
    wherein an acute angle is formed between a main axis of the particle beam column generating the particle beam used for the scanning of the particle beam across the surface of the object and a main axis of a particle beam column generating the particle beam used for the removing and the depositing, respectively, and
    wherein an orientation of the object relative to the particle beam column used for the removing and depositing, respectively, is changed between the scanning of the particle beam and the removing and the depositing, respectively, by less than 0.5 times said acute angle.

2. The method according to claim 1, wherein the particle beam used for the scanning is an electron beam generated by an electron beam column, and wherein the particle beam used for the removing and the depositing, respectively, of material is an ion beam generated by an ion beam column.

3. The method according to claim 1, wherein the particle beam used for the scanning is an ion beam generated by an ion beam column, and wherein the particle beam used for the removing and the depositing, respectively, of material is an ion beam generated by an ion beam column.

4. The method according to claim 1, wherein the particle beam used for the scanning is an electron beam generated by an electron beam column, and wherein the particle beam used for the removing and the depositing, respectively, of material is an electron beam generated by an electron beam column.

5. The method according to claim 1, wherein a main axis of a particle beam column generating the particle beam used for the scanning of the particle beam across the surface of the object and a main axis of a particle beam column generating the particle beam used for the removing and the depositing, respectively, of material, form an acute angle, wherein the acute angle is greater than 40°.

6. The method according to claim 1, wherein the detecting of the electrons emerging from the object due to the scanning comprises a first detecting in a first angular configuration and, simultaneously, a second detecting in a second angular configuration different from the first angular configuration.

7. The method according to claim 6, wherein the first detecting is performed using a first detector and the second detecting is performed using a second detector different from the first detector.

8. The method according to claim 1, wherein the scanning of the particle beam across the surface of the object and the detecting of the electrons emerging from the object due to the scanning comprises a first scanning and detecting in a first angular configuration and a second scanning and detecting in a second angular configuration different from the first angular configuration.

9. The method according to claim 8, wherein the first scanning and detecting comprises directing of the particle beam onto the object along a first direction, wherein the second scanning and detecting comprises directing of the particle beam onto the object along a second direction, and wherein an angle between the first direction and the second direction is greater than 30 mrad.

10. The method according to claim 8, wherein the detecting of the electrons emerging from the object due to the scanning in the first angular configuration comprises detecting of electrons emitted into a first range of solid angles, wherein the detecting of the electrons emerging from the object due to the scanning in the second angular configuration comprises detecting of electrons emitted into a second range of solid angles, and wherein an angle between a main axis of the first range of solid angles and a main axis of the second range of solid angles is greater than 10°.

11. The method according to claim 1, wherein, during the scanning of the particle beam across the surface of the object, an area of the surface of the object of more than 1.0 µm² has a surface normal oriented under an angle of less than 20° to a main axis of a particle beam column generating the particle beam used for the scanning of the particle beam across the surface of the object.

12. The method according to claim 1, wherein, during the directing of the particle beam to the plurality of locations on the surface of the object, an area of the surface of the object of more than 1.0 µm² has a surface normal oriented under an angle of less than 70° to a main axis of a particle beam column generating the particle beam used for the removing and the depositing of material, respectively.

13. The method according to claim 1, further comprising supplying a process gas to the object while the particle beam is directed to the plurality of locations on the surface of the object.

14. The method according to claim 1, wherein a scanned region of the object comprises a first surface portion and a second surface portion, wherein the first surface portion is provided by a first material and the second surface portion is provided by a second material, and wherein the first material has an ion beam removal rate which is at least 1.5 times greater than an ion beam removal rate of the second material.

15. The method according to claim 1, wherein the scanning of the particle beam across the surface of the object and the detecting of the electrons emerging from the object due to the scanning, the determining of the height differences, the determining of the processing intensities and the directing of the particle beam to the plurality of locations are performed until a surface roughness of the surface is achieved which fulfills the following relation:

$$\sigma_{RMS} < 1 \text{ µm},$$

wherein $\sigma_{RMS}$ represents a root-mean-square value of the surface roughness determined at a length scale within a range from 0.2 µm to 100 µm.

16. A method of processing of an object, wherein the method comprises:
a sequence, wherein the sequence comprises:
scanning a particle beam across a surface of the object and detecting electrons emerging from the object due to the scanning;
determining a height difference between a predetermined surface and the surface of the object for each of a plurality of locations of the predetermined surface of the object based on the detected electrons;
determining a processing intensity for each of the plurality of locations of the predetermined surface of the object based on the determined height differences; and
directing a particle beam to the plurality of locations based on the determined processing intensities, in order to remove material from or deposit material on the object at the plurality of locations,
wherein the sequence is repeatedly performed for each of the plurality of locations of the predetermined surface of the object,
wherein the directing of the particle beam to the plurality of locations on the surface of the object achieves a surface roughness fulfilling the following relation:

$$\sigma_{RMS} < 1 \text{ µm},$$

wherein $\sigma_{RMS}$ represents a root-mean-square value of the surface roughness determined at a length scale within a range from 0.2 µm to 100 µm, wherein $\sigma_{RMS} < 100$ nm, and wherein the scanning of the particle beam across the surface of the object and the detecting of the electrons emerging from the object due to the scanning, the determining of the height differences, the determining of the processing intensities and the directing of the particle beam to the plurality of locations are repeated until a maximum value of the determined height differences is less than 10 nm.

17. The method according to claim 16, wherein an area of the surface of the object in which the surface roughness is achieved is greater than 0.1 µm².

18. The method according to claim 16, wherein the surface of the object in which the surface roughness is achieved is a flat surface.

19. A method of processing of an object, wherein the method comprises:
scanning a particle beam across a surface of the object and detecting electrons emerging from the object due to the scanning;
determining a height difference between a predetermined surface and the surface of the object for each of a plurality of locations of the predetermined surface of the object based on the detected electrons;
determining a processing intensity for each of the plurality of locations of the predetermined surface of the object based on the determined height differences; and
directing a particle beam to the plurality of locations based on the determined processing intensities, in order to remove material from or deposit material on the object at the plurality of locations,
wherein a scanned region of the object comprises a first surface portion and a second surface portion,
wherein the first surface portion is provided by a first material and the second surface portion is provided by a second material,
wherein the first material has an ion beam removal rate which is at least 1.5 times greater than an ion beam removal rate of the second material,
wherein during the directing material is removed from both the first surface portion and the second surface portion, and
wherein the directing of the particle beam to the plurality of locations on the predetermined surface achieves a surface roughness fulfilling the following relation:

$$\sigma_{RMS} < 1 \text{ µm},$$

wherein $\sigma_{RMS}$ represents a root-mean-square value of the surface roughness determined at a length scale within a range from 0.2 µm to 100 µm.

20. The method of processing of an object according to claim 19, wherein the particle beam used for the scanning is an electron beam generated by an electron beam column, and wherein the particle beam used for the removing and the depositing, respectively, of material is an ion beam generated by an ion beam column.

21. The method of processing of an object according to claim 19, wherein the object is simultaneously located within a work area of a particle beam column generating the particle beam used for the scanning of the particle beam across the surface of the object and a work area of a particle beam column generating the particle beam used for the removing and the depositing of material, respectively, and wherein an orientation of the object relative to the particle beam column used for the removing and depositing, respectively, is changed between the scanning of the particle beam and the removing and the depositing, respectively, by less than 0.5 times an acute angle between a main axis of the particle beam column generating the particle beam used for the scanning of the particle beam across the surface of the object and a main axis of a particle beam column generating the particle beam used for the removing and the depositing of material, respectively.

22. The method of processing of an object according to claim 19, wherein the object is simultaneously located within a work area of a particle beam column generating the particle beam used for the scanning of the particle beam across the surface of the object and a work area of a particle beam column generating the particle beam used for the removing and the depositing of material, respectively, and wherein an orientation of the object relative to the particle beam column used for the removing and depositing, respectively, remains substantially unchanged between the scanning of the particle beam and the removing and the depositing, respectively.

23. The method of processing of an object according to claim 19, wherein the detecting of the electrons emerging from the object due to the scanning comprises a first detecting in a first angular configuration and, simultaneously, a second detecting in a second angular configuration different from the first angular configuration.

24. The method of processing of an object according to claim 19, wherein the detecting of the electrons emerging from the object due to the scanning in the first angular configuration comprises detecting of electrons emitted into a first range of solid angles, wherein the detecting of the electrons emerging from the object due to the scanning in the second angular configuration comprises detecting of electrons emitted into a second range of solid angles, and wherein an angle between a main axis of the first range of solid angles and a main axis of the second range of solid angles is greater than 10°.

25. The method of processing of an object according to claim 19, wherein an area of the surface of the object in which the surface roughness is achieved is greater than 0.1 µm².

26. The method of processing of an object according to claim 19, wherein the scanning of the particle beam across the surface of the object and the detecting of electrons emerging from the object due to the scanning, the determining of the height differences, the determining of the processing intensities, and the directing of the particle beam to the plurality of locations are repeatedly performed.

27. The method of processing of an object according to claim 19, wherein the scanning of the particle beam across the surface of the object and the detecting of the electrons emerging from the object due to the scanning, the determining of the height differences, the determining of the processing intensities and the directing of the particle beam to the plurality of locations are repeated until a maximum value of the determined height differences is less than 10 nm.

28. A method of processing of an object, wherein the method comprises:
   a sequence, wherein the sequence comprises:
      scanning a particle beam across a surface of the object and detecting electrons emerging from the object due to the scanning;
      determining a height difference between a predetermined surface and the surface of the object for each of a plurality of locations of the predetermined surface of the object based on the detected electrons;
      determining a processing intensity for each of the plurality of locations of the predetermined surface of the object based on the determined height differences; and
      directing a particle beam to the plurality of locations based on the determined processing intensities, in order to remove material from or deposit material on the object at the plurality of locations,
   wherein the sequence is repeatedly performed for each of the plurality of locations of the predetermined surface of the object,
   wherein the object is simultaneously located within a work area of a particle beam column generating the particle beam used for the scanning of the particle beam across the surface of the object and a work area of a particle beam column generating the particle beam used for the removing and the depositing, respectively, and
   wherein an orientation of the object relative to the particle beam column used for the removing and depositing, respectively, remains substantially unchanged between the scanning of the particle beam and the removing and the depositing, respectively.

29. The method according to claim 28, wherein the particle beam used for the scanning is an electron beam generated by an electron beam column, and wherein the particle beam used for the removing and the depositing, respectively, of material is an ion beam generated by an ion beam column.

30. The method according to claim 28, wherein the particle beam used for the scanning is an ion beam generated by an ion beam column, and wherein the particle beam used for the removing and the depositing, respectively, of material is an ion beam generated by an ion beam column.

31. The method according to claim 28, wherein the particle beam used for the scanning is an electron beam generated by an electron beam column, and wherein the particle beam used for the removing and the depositing, respectively, of material is an electron beam generated by an electron beam column.

32. The method according to claim 28, wherein a main axis of a particle beam column generating the particle beam used for the scanning of the particle beam across the surface of the object and a main axis of a particle beam column generating the particle beam used for the removing and the depositing, respectively, of material, form an acute angle, wherein the acute angle is greater than 40°.

33. The method according to claim 28, wherein the detecting of the electrons emerging from the object due to the scanning comprises a first detecting in a first angular configuration and, simultaneously, a second detecting in a second angular configuration different from the first angular configuration.

34. The method according to claim 33, wherein the first detecting is performed using a first detector and the second detecting is performed using a second detector different from the first detector.

35. The method according to claim 28, wherein the scanning of the particle beam across the surface of the object and the detecting of the electrons emerging from the object due to the scanning comprises a first scanning and detecting in a first angular configuration and a second scanning and detecting in a second angular configuration different from the first angular configuration.

36. The method according to claim 35, wherein the detecting of the electrons emerging from the object due to the scanning in the first angular configuration comprises detecting of electrons emitted into a first range of solid angles, wherein the detecting of the electrons emerging from the object due to the scanning in the second angular configuration comprises detecting of electrons emitted into a second range of solid angles, and wherein an angle between a main axis of the first range of solid angles and a main axis of the second range of solid angles is greater than 10°.

37. The method according to claim 28, wherein, during the scanning of the particle beam across the surface of the object, an area of the surface of the object of more than 1.0 µm² has a surface normal oriented under an angle of less than 20° to a main axis of a particle beam column generating the particle beam used for the scanning of the particle beam across the surface of the object.

38. The method according to claim 28, wherein, during the directing of the particle beam to the plurality of locations on the surface of the object, an area of the surface of the object of more than 1.0 µm² has a surface normal oriented under an angle of less than 70° to a main axis of a particle beam column generating the particle beam used for the removing and the depositing of material, respectively.

39. The method according to claim 28, further comprising supplying a process gas to the object while the particle beam is directed to the plurality of locations on the surface of the object.

40. The method according to claim 28, wherein a scanned region of the object comprises a first surface portion and a second surface portion, wherein the first surface portion is provided by a first material and the second surface portion is provided by a second material, and wherein the first material has an ion beam removal rate which is at least 1.5 times greater than an ion beam removal rate of the second material.

* * * * *